(12) United States Patent
Mishima et al.

(10) Patent No.: US 7,935,557 B2
(45) Date of Patent: May 3, 2011

(54) MANUFACTURING METHOD OF A PHOTOELECTRIC CONVERSION DEVICE

(75) Inventors: Ryuichi Mishima, Machida (JP); Mineo Shimotsusa, Machida (JP); Hiroaki Naruse, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 12/622,747

(22) Filed: Nov. 20, 2009

(65) Prior Publication Data
US 2010/0173444 A1    Jul. 8, 2010

(30) Foreign Application Priority Data
Jan. 8, 2009  (JP) ................................. 2009-002917

(51) Int. Cl.
*H01L 21/266* (2006.01)
*H01L 21/339* (2006.01)

(52) U.S. Cl. ............ 438/60; 438/75; 438/525; 438/595; 257/E21.345; 257/E21.346

(58) Field of Classification Search .................... 438/73, 438/60, 75, 525, 595; 257/E21.345, E21.346
See application file for complete search history.

(56) References Cited

U.S. PATENT DOCUMENTS

| 7,205,523 B2 | 4/2007 | Mishima et al. | ........... 250/208.1 |
| 7,345,703 B2 * | 3/2008 | Lee | ................. 348/272 |
| 7,365,380 B2 | 4/2008 | Yuzurihara et al. | ........... 257/292 |
| 7,411,170 B2 | 8/2008 | Shimotsusa et al. | ........ 250/208.1 |
| 7,625,774 B2 * | 12/2009 | Lee | ................................ 438/60 |
| 2005/0151212 A1 * | 7/2005 | Hong | .............................. 257/413 |
| 2006/0243981 A1 * | 11/2006 | Rhodes | ............................. 257/72 |
| 2007/0205439 A1 | 9/2007 | Okita et al. | .................... 257/228 |
| 2008/0029793 A1 | 2/2008 | Watanabe et al. | ............. 257/291 |
| 2008/0054388 A1 | 3/2008 | Nakata et al. | ................... 257/432 |
| 2008/0057615 A1 | 3/2008 | Okagawa et al. | ................ 438/73 |
| 2008/0203450 A1 | 8/2008 | Naruse et al. | ................... 257/290 |
| 2008/0203509 A1 | 8/2008 | Mishima et al. | ............... 257/432 |
| 2009/0250778 A1 | 10/2009 | Shimotsusa | .................... 257/432 |

FOREIGN PATENT DOCUMENTS

| JP | 2001-345437 A | 12/2001 |
| JP | 2005-123517 A | 5/2005 |
| JP | 2008-041726 A | 2/2008 |

* cited by examiner

*Primary Examiner* — Mary Wilczewski
*Assistant Examiner* — Toniae M Thomas
(74) *Attorney, Agent, or Firm* — Fitzpatrick, Cella, Harper & Scinto (57) ABSTRACT

A manufacturing method of a photoelectric conversion device included a first step of forming a gate electrode, a second step of forming a semiconductor region of a first conductivity type, a third step of forming an insulation film, and a fourth step of forming a protection region of a second conductivity type, which is the opposite conductivity type to the first conductivity type, by implanting ions in the semiconductor region using the gate electrode of the transfer transistor and a portion covering a side face of the gate electrode of the transfer transistor of the insulation film as a mask in a state in which the semiconductor substrate and the gate electrode of the transfer transistor are covered by the insulation film, and causing a portion of the semiconductor region of the first conductivity type from which the protection region is removed to be the charge accumulation region.

10 Claims, 6 Drawing Sheets

MANUFACTURING METHOD OF A PHOTOELECTRIC CONVERSION DEVICE

BACKGROUND OF THE INVENTION

1. Field of the Invention

The present invention relates to the manufacturing method of a photoelectric conversion device.

2. Description of the Related Art

As shown in FIG. 1 of Japanese Patent Laid-Open No. 2005-123517, installing an n-layer 104 that is an n-type semiconductor region for accumulating charges and a p-layer 105 that is a p-type semiconductor region on that n-layer 104 in a photodiode of a solid-state imaging device is described in Japanese Patent Laid-Open No. 2005-123517. According to Japanese Patent Laid-Open No. 2005-123517, it is possible to suppress the dark current on the light-receiving surface of the photodiode by this structure.

Installing a bypass region 106 that continuously extends from the n-layer 104 to the bottom of the gate region 103 (control electrode) of a transfer MOS transistor is disclosed in Japanese Patent Laid-Open No. 2005-123517. The width of this bypass region 106 is controlled by implanting BF2 ions diagonally (at an implantation angle of θ=7°) using a photoresist 609 and a control electrode 603 as masking materials, as shown in FIG. 4 of Japanese Patent Laid-Open No. 2005-123517. Alternatively, the width of this bypass region 106 is controlled by implanting BF2 ions diagonally (at an implantation angle of θ=7° using a photoresist 1109, a control electrode 1103 and a side spacer 1111 as masking materials, as shown in FIG. 6 of Japanese Patent Laid-Open No. 2005-123517. By this, according to Japanese Patent Laid-Open No. 2005-123517, the process precision of the bypass region can be improved.

As shown in FIG. 5(b) of Japanese Patent Laid-Open No. 2008-041726, introducing an n-type impurity to form a photodiode semiconductor region 33 after forming gate electrodes 31, 32 in a pixel array region 101 and a gate region 42 in a peripheral circuit region 102 is described in Japanese Patent Laid-Open No. 2008-041726. After that, a p-type impurity is introduced and a surface p-type region 35 for structuring the photodiode to be embedded is formed. Furthermore, an n-type impurity is introduced by ion implantation using a gate electrode as a masking material, and semiconductor regions 3, 34, 44 comprising a portion of a source and drain are formed.

As shown in FIG. 5(c) of Japanese Patent Laid-Open No. 2008-041726, forming a silicon nitride film 36 so as to cover a pixel array region 101 and a peripheral circuit region 102, and forming a silicon oxide film 37 thereon is described in Japanese Patent Laid-Open No. 2008-041726.

Furthermore, as shown in FIG. 5(d) of Japanese Patent Laid-Open No. 2008-041726, forming a side spacer on the side face of the gate electrode 42 in the peripheral circuit region 102 by etching the silicon nitride film 36 and a silicon oxide film 37 in the peripheral circuit region 102 is described in Japanese Patent Laid-Open No. 2008-041726. At this time, a silicon nitride film 36 and a silicon oxide film 37 remain on the entire surface of the pixel array region 101. By this, structure it is possible to increase the width of the potential grading layer of the MOS transistor in the pixel array region, and also decrease the width of the potential grading layer of the MOS transistor in the peripheral circuit region 102. As a result, according to Japanese Patent Laid-Open No. 2008-041726, it is possible to achieve both the suppression of characteristic degradation due to a hot carrier of a MOS transistor in the pixel array region, and the realization of high-drive performance of a MOS transistor in the peripheral circuit region.

In Japanese Patent Laid-Open No. 2005-123517, forming a side spacer 1111 by coating the entire surface of a semiconductor with a film formed from SiO or SiN, and thereafter performing etching to leave only a predetermined portion is described. Specifically, a side spacer 1111 such as that shown in FIG. 6(b) of Japanese Patent Laid-Open No. 2005-123517 is formed by performing etching in a state in which a photodiode is protected by masking using a film made of SiO or SiN and a photoresist, as shown in FIG. 7 of Japanese Patent Laid-Open No. 2005-123517. By this, according to Japanese Patent Laid-Open No. 2005-123517, it is possible to suppress dark current that occurs in the photodiode.

However, in the technique of Japanese Patent Laid-Open No. 2005-123517, there is a possibility that the photodiode sustains etching damage when removing the film that masks the photodiode or the photoresist by etching after the process to form the side spacer 1111 is finished.

Incidentally, with the increase in the number of pixels in an imaging device such as a CMOS sensor, there is a demand for a reduction in chip area. Accordingly, there is a demand for a smaller peripheral circuit (a MOS transistor in the peripheral region). In contrast to this, in a pixel array region in which a plurality of pixels are arranged, an improvement in the charge transfer efficiency from the photodiode to a floating diffusion unit by a transfer transistor is prioritized over the shrinking of pixel dimension. Here, a case in which the photodiode is comprised of a charge accumulation region including an n-type impurity for accumulating charges and a protection region including a p-type impurity and arranged on that charge accumulation region is considered. In order to achieve both a reduction in dark current in the photodiode and an improvement in the charge transfer efficiency by the transfer MOS transistor, there is a necessity to form a protection region at a position on the charge accumulation region having an appropriate offset from the gate electrode of the transfer MOS transistor.

Supposing this offset is too small, the potential barrier due to the protection region poses as an impediment when charges accumulated in the charge accumulation region travel toward the channel region of the transfer MOS transistor, and the charge transfer efficiency decreases. Supposing this offset is too large, the portion of the charge accumulation region (including a n-type layer and a bypass region) exposed to the surface of the semiconductor substrate increases, and the amount of dark current in the photodiode increases. Therefore, this offset must be finely controlled to a value determined to achieve both a reduction in dark current in the photodiode and an improvement in the charge transfer efficiency of the transfer MOS transistor.

There is no description relating to a method of improving the control precision of the offset of the surface p-type region from the gate electrode 31 of the transfer MOS transistor in Japanese Patent Laid-Open No. 2008-041726.

SUMMARY OF THE INVENTION

The present invention provides a method for reducing the amount of etching damage sustained by the photoelectric conversion unit, and for improving the control precision of the offset of a protection area of the photoelectric conversion unit from the gate electrode of a transfer transistor in a photoelectric conversion device.

The manufacturing method of a photoelectric conversion unit according to one aspect of the present invention is a manufacturing method of a photoelectric conversion device that has a pixel array region in which a plurality of pixels are to be arrayed, each including a photoelectric conversion unit that has a charge accumulation region and a protection region arranged on the charge accumulation region, a charge-voltage converter, a transfer transistor that transfers charges in the charge accumulation region to the charge-voltage converter, and an output unit that outputs a signal in accordance with a voltage of the charge-voltage converter. The method comprises: a first step of forming a gate electrode of the transfer transistor in the pixel array region on a semiconductor substrate; a second step of forming a semiconductor region of a first conductivity type in the pixel array region of the semiconductor substrate; a third step of forming an insulation film so as to cover the semiconductor substrate and the gate electrode of the transfer transistor; and a fourth step of forming the protection region of a second conductivity type, which is the opposite conductivity type to the first conductivity type, by implanting ions in the semiconductor region of the semiconductor substrate using the gate electrode of the transfer transistor and a portion of the insulation film, which covers a side face of the gate electrode of the transfer transistor, as a mask in a state in which the semiconductor substrate and the gate electrode of the transfer transistor are covered by the insulation film, and causing a portion of the semiconductor region of the first conductivity type other than the protection region to be the charge accumulation region.

According to the present invention, it is possible to reduce the etching damage sustained by a photoelectric conversion unit and to improve the control precision of the offset of a protection region of the photoelectric conversion unit from a gate electrode of a transfer transistor in a photoelectric conversion device.

Further features of the present invention will become apparent from the following description of exemplary embodiments with reference to the attached drawings.

DESCRIPTION OF THE EMBODIMENTS

Figure 1:
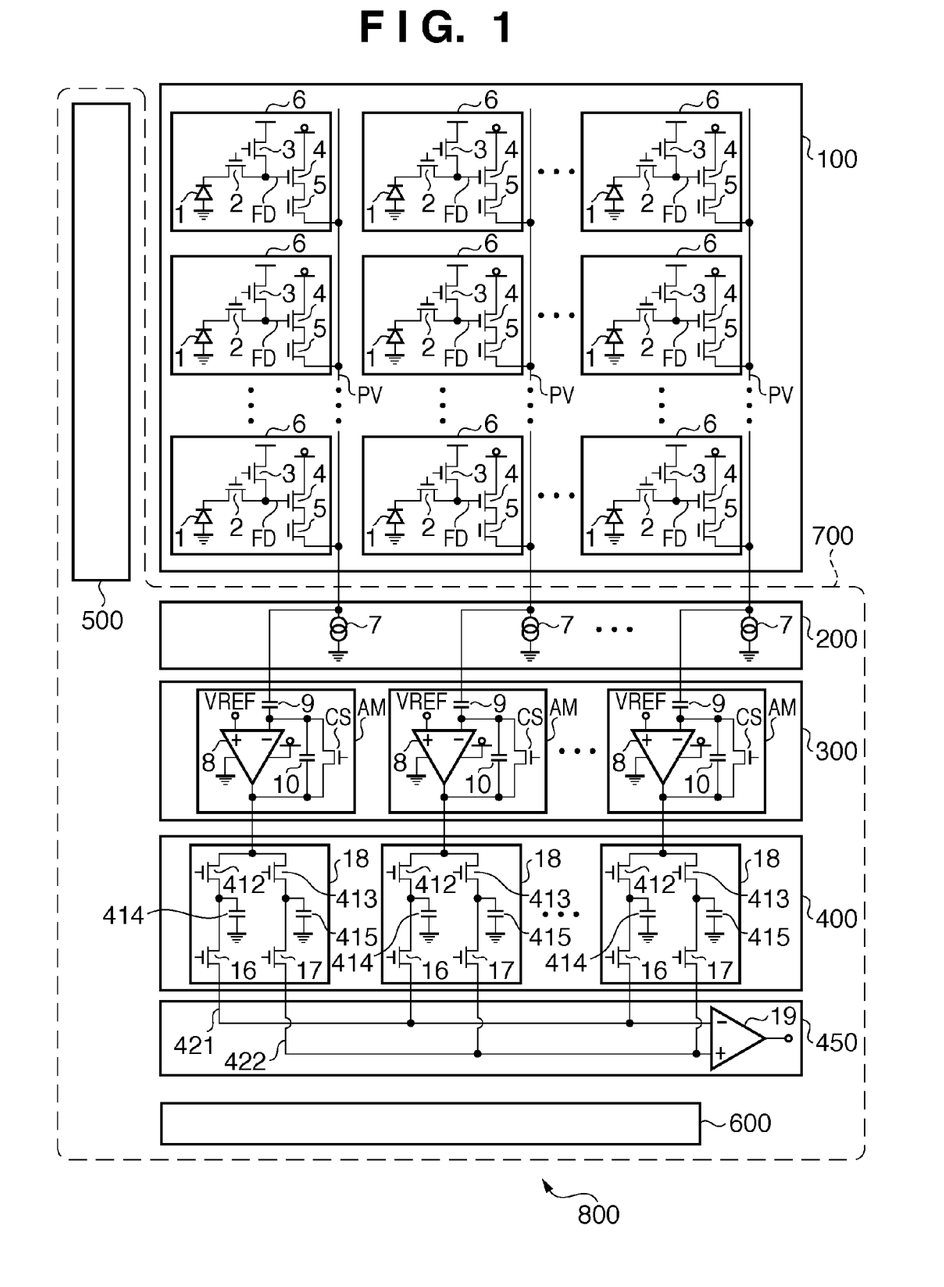
FIG. 1 is a diagram illustrating the structure of the photoelectric conversion device 800 according to an embodiment of the present invention.

The overall structure of the photoelectric conversion device 800 according to an embodiment of the present invention will be explained using FIG. 1. FIG. 1 is a diagram illustrating the structure of the photoelectric conversion device 800 according to an embodiment of the present invention.

The photoelectric conversion device 800 has a pixel array region 100 and peripheral region 700. The pixel array region 100 is a region in which a plurality of pixels are arrayed. The peripheral region 700 is a region arranged in the peripheral region of the pixel array region 100, and is a region in which a plurality of control circuits are arranged. Each of the plurality of control circuits includes a MOS transistor for controlling a plurality of pixels and a circuit that acts as a readout path.

A plurality of pixels 6 are arranged in a direction along rows and in a direction along columns in the pixel array region 100.

Each pixel 6 includes a photoelectric conversion unit 1, a transfer transistor 2, a charge-voltage converter FD, a reset unit 3, an output unit 4, and a selection unit 5.

The photoelectric conversion unit 1 generates and accumulates charges (signal) in accordance with light. The photoelectric conversion unit 1 is, for example, a photodiode. As will be hereinafter described, the photoelectric conversion unit 1 includes a charge accumulation region 11 for accumulating charges and a protection region 14 for protecting the charge accumulation region 11 (refer to FIG. 2).

The transfer transistor 2 transfers charges in the charge accumulation region 11 to the charge-voltage converter FD. The transfer transistor 2 transfers charges in the charge accumulation region 11 to the charge-voltage converter FD by turning on when a transfer control signal with an active level is supplied to a gate from a vertical scanning circuit 500, to be hereinafter described.

The charge-voltage converter FD converts the transferred charges to a voltage. The charge-voltage converter FD is, for example, a floating diffusion region.

The reset unit 3 resets the charge-voltage converter FD. The reset unit 3 is, for example, a reset transistor, and resets the charge-voltage converter FD by turning on when a reset control signal with an active level is supplied to a gate from the vertical scanning circuit 500.

The output unit 4 outputs a signal according to the voltage of the charge-voltage converter FD. The output unit 4 is, for example, an amplifier transistor, and outputs a signal according to the voltage of the charge-voltage converter FD to a column signal line PV by executing a source-follower operation along with a constant current supply 7 connected to the column signal line PV. That is, the output unit 4 outputs a noise signal according to the voltage of the charge-voltage converter FD to a column signal line PV in a state in which the charge-voltage converter FD has been reset by the reset unit 3. The output unit 4 outputs a light signal according to the voltage of the charge-voltage converter FD to the column signal line PV in a state in which the charges in the charge accumulation region 11 has been transferred to the charge-voltage converter FD by the transfer transistor 2.

The selection unit 5 sets a pixel 6 to a selected/unselected state. The selection unit 5 is, for example, a selection transistor, and sets a pixel 6 to the selected state by turning on when a transfer control signal with an active level is supplied to a gate from the vertical scanning circuit 500. The selection unit 5 sets a pixel 6 to the unselected state by turning off when a transfer control signal with a non-active level is supplied to the gate from the vertical scanning circuit 500.

A plurality of control circuits are arranged in the peripheral region 700, as described above. The plurality of circuits are the vertical scanning circuit 500, a constant current supply block 200, a column amplifier block 300, a holding capacitance block 400, a horizontal scanning circuit 600, and an output amplifier block 450.

The vertical scanning circuit 500 selects a row (readout row) from which to read out a signal by scanning the pixel array region 100 in the vertical direction (direction along the columns), and allows a signal (noise signal, light signal) to be read out from that selected readout row. The vertical scanning circuit 500 includes a plurality of MOS transistors.

The constant current supply block 200 corresponds to a plurality of column signal lines PV connected to a plurality of rows in the pixel array region 100, and includes a plurality of constant current supplies 7. Each constant current supply 7 includes, for example, a MOS transistor.

The column amplifier block 300 corresponds to a plurality of column signal lines PV, and includes a plurality of column amplifier units AM. The plurality of column amplifier units AM are arranged in the direction along the rows.

Each column amplifier unit AM includes, for example, a differential amplifier 8, clamp capacitor 9, feedback capacitance 10, and clamp control switch CS. Each column amplifier unit AM outputs the offset of the differential amplifier 8 as a first signal. Each column amplifier unit AM also outputs a signal in which the offset of the differential amplifier 8 overlaps the difference signal of the light signal and noise signal as a second signal. The clamp control switch CS includes, for example, a MOS transistor.

The holding capacitance block 400 includes a plurality of column signal holding units 18 corresponding to a plurality of column amplifier units AM. The plurality of column signal holding units 18 are arranged in the direction along the rows.

Each column signal holding unit 18 includes a first writing transistor 412, a second writing transistor 413, a first holding capacitor 414, a second holding capacitor 415, a first transistor 16, and a second transistor 17.

The first writing transistor (MOS transistor) 412, when turned on, writes the first signal output from the column amplifier unit AM to the first holding capacitor 414. After that, when the first writing transistor 412 is turned off, the first holding capacitor 414 holds the first signal.

The second writing transistor (MOS transistor) 413, when turned on, writes the second signal output from the column amplifier unit AM to the second holding capacitor 415. After that, when the second writing transistor 413 is turned off, the second holding capacitor 415 holds the second signal.

The first transfer transistor (MOS transistor) 16, when turned on, transfers the first signal held in the first holding capacitor 414 through a first output line 421 to an output amplifier 19.

The second transfer transistor (MOS transistor) 17, when turned on, transfers the second signal held in the second holding capacitor 415 through the second output line 422 to the output amplifier 19.

The horizontal scanning circuit 600 causes the signal in each column of the readout row signal held in the holding capacitance block 400 to be sequentially transferred to the output amplifier 19 by scanning the holding capacitance block 400 in the horizontal direction (direction along the rows). That is, the horizontal scanning circuit 600 sequentially turns on the first transistor 16 and second transistor 17 of each column.

The output amplifier block 450 includes a first output line 421*a*, second output line 422, and an output amplifier 19. The output amplifier 19 generates an image signal by executing CDS processing that takes the difference between a first signal transferred through the first output line 421 and a second signal transferred through the second output line 422, and outputs it. The output amplifier 19 includes, for example, a plurality of MOS transistors.

Figure 2:
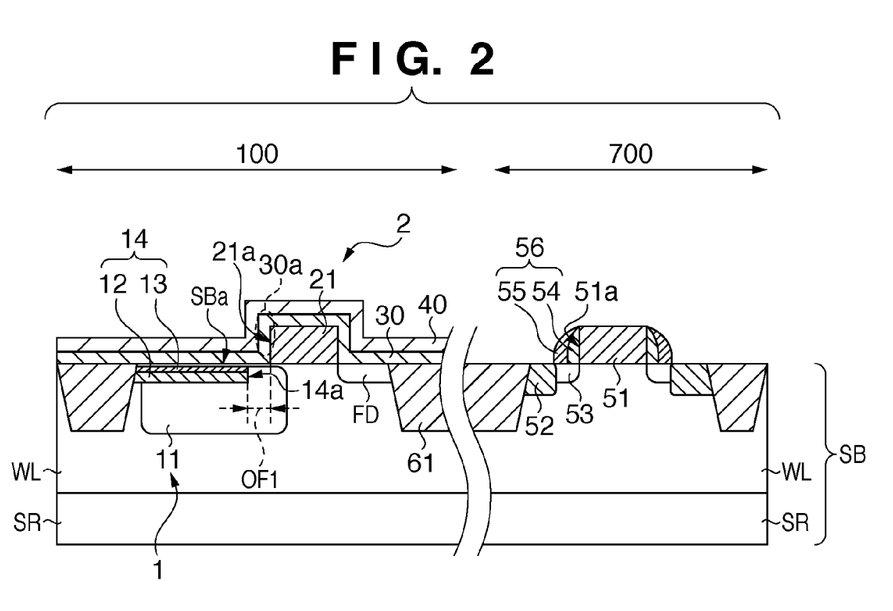
FIG. 2 is a diagram illustrating a cross-section of the structure of the photoelectric conversion device 800 according to the embodiment of the present invention.

Next, the cross-section of the structure of the photoelectric conversion device 800 according to the embodiment of the present invention will be explained using FIG. 2. FIG. 2 is a diagram illustrating a cross-section of the structure of the photoelectric conversion device 800 according to an embodiment of the present invention.

The photoelectric conversion device 800 is provided with a semiconductor substrate SB, a gate electrode 21, a gate electrode 51, an insulation film 30, an insulation film 40, and a side wall spacer 56.

The semiconductor substrate SB includes a semiconductor region SR, a well WL, an element isolation portion 61, a photoelectric conversion unit 1, a charge-voltage converter FD, a semiconductor region 52, and an LDD region 53. The semiconductor region SR, the well WL and the element isolation portion 61 are arranged in the pixel array region 100 and peripheral region 700. The photoelectric conversion unit 1 and the charge-voltage converter FD are arranged in the pixel array region 100. The semiconductor region 52 and the LDD region 53 are arranged in the peripheral region 700.

The semiconductor region SR is arranged at a position deep under the surface SBa of the semiconductor substrate SB. The semiconductor region SR includes an impurity (for example, phosphor) of a first conductivity type (for example, N-type) at a low density.

The well WL is arranged on the semiconductor region SR (surface SBa side) of the semiconductor substrate SB. The well WL includes an impurity (for example, boron) of a second conductivity type (for example, P-type) at a low density. The second conductivity type is the opposite conductivity type to the first conductivity type.

The element isolation portion 61 is arranged so as to isolate the plurality of elements in the well (for example, the photoelectric conversion unit 1, the source/drain of the first transistor 2, and the source/drain of the MOS transistor) from each other. The element isolation portion 61 has, for example, an STI-type element isolation structure or a LOCOS-type element isolation structure.

The photoelectric conversion unit 1 includes a charge accumulation region 11 and a protection region 14.

The charge accumulation region 11 is a region for accumulating charges, and includes an impurity (for example, phosphor) of a first conductivity type (for example, N-type) at a higher density than the impurity density of the second conductivity type in the well WL.

The protection region 14 is arranged on the charge accumulation region 11 (surface SBa side) of the semiconductor substrate SB so as to protect the charge accumulation region 11. The border 14*a* of the protection region 14 facing the gate electrode 21 is arranged at a position having an offset OF1 from the plane including the side face 21*a* of the gate electrode 21 in the gate length direction. This offset OF1 is controlled by controlling the thickness of the insulation film 30, as will be hereinafter described. That is, the protection region 14 is formed to be self-aligning using the gate electrode 21 and the portion 30*a* of the insulation film 30 that covers the side face 21*a* of the gate electrode 21 as a mask.

The protection region 14 has, for example, a two-layered structure and includes a first layer 12 and second layer 13. The first layer 12 is arranged on top (the surface SBa side) of the charge accumulation region 11. The first layer 12 includes an impurity (for example, boron) of a second conductivity type at a first density. The second layer 13 is arranged on top (the surface SBa side) of the first layer 12. The second layer 13 includes an impurity of the second conductivity type at a second density that is higher than the first density. That is, the first layer 12 and the second layer 13 are arranged such that the impurity density on the surface SBa side is higher, and the impurity density on the charge accumulation region 11 side is lower.

By this, it is possible to reduce the dark current generated from the surface SBa of the semiconductor substrate SB, and to lower the potential barrier due to the protection region 14 when charges are transferred. Also, since the impurity density on the charge accumulation region 11 side is low, a reduction in the saturation charges of the charge accumulation region 11 can be suppressed. That is, it is possible to easily attain both an improvement in charge transfer efficiency and a reduction in dark current by structuring the protection region 14 to be 2-layered.

Note that, because ion implantation must be done twice, it is possible to select a structure in consideration of a balance between structural cost and performance. For example, a single-layered structure is also possible for the protection region 14.

The charge-voltage converter FD is a region for temporarily holding charges transferred from the charge accumulation region 11, and includes an impurity (for example, phosphor) of a first conductivity type (for example, N-type) at a density that is higher than the impurity density of the second conductivity type in the well WL.

The semiconductor region 52 is a region for temporarily holding charges, and includes an impurity (for example, phosphor) of a first conductivity type (for example, N-type) at a density that is higher than that of the well WL. The semiconductor region 52 functions as a source electrode or drain electrode of the aforementioned MOS transistor. The semiconductor region 52 is formed to be self-aligning using a gate electrode 51 and a side wall spacer 56 as a mask, as will be hereinafter described.

The LDD region 53 is a region for alleviating the electric fields of the gate electrode 51 and semiconductor region 52 when a voltage is applied to the gate electrode 51, and includes an impurity of the first conductivity type at a density that is lower than that of the semiconductor region 52. The LDD region 53 is formed to be self-aligning using the gate electrode 51 as a mask, as will be hereinafter described.

The gate electrode 21 is arranged above the surface SBa of the semiconductor substrate SB in the pixel array region 100. The gate electrode 21 is a gate electrode of the aforementioned transfer transistor 2. A side wall spacer is not arranged at the position neighboring the side face 21a of the gate electrode 21.

The gate electrode 51 is arranged above the surface SBa of the semiconductor substrate SB in the peripheral region 700. The gate electrode 51 is a gate electrode of the aforementioned MOS transistor. A side wall spacer 56 is arranged at the position neighboring the side face 51a of the gate electrode 51.

The insulation film 30 extends so as to cover the semiconductor substrate SB and the gate electrode 21 in the pixel array region 100. The insulation film 30 is not arranged in the peripheral region 700. The insulation film 30 is formed from, for example, silicon nitride.

The insulation film 40 extends so as to cover the insulation film 30 in the pixel array region 100. The insulation film 40 is not arranged in the peripheral region 700. The insulation film 40 is formed from, for example, silicon oxide.

The side wall spacer 56 is arranged on the surface SBa of the semiconductor substrate SB in the peripheral region 700 at a position neighboring the side face 51a of the gate electrode 51. The side wall spacer 56 includes a first film 54 and a second film 55. The first film 54 is arranged to neighbor the side face 51a of the gate electrode 51. The second film 55 is arranged to neighbor the first film 54. The first film 54 is formed from the same material as the insulation film 30, and is formed from, for example, silicon nitride. The second film 55 is formed from the same material as the insulation film 40, and is formed from, for example, silicon oxide. Moreover, a film formed from silicon oxide may be installed between the insulation film 30 and semiconductor substrate SB, between the insulation film 30 and the gate electrode 21, and between the first film 54 and the gate electrode 51.

Figure 3:
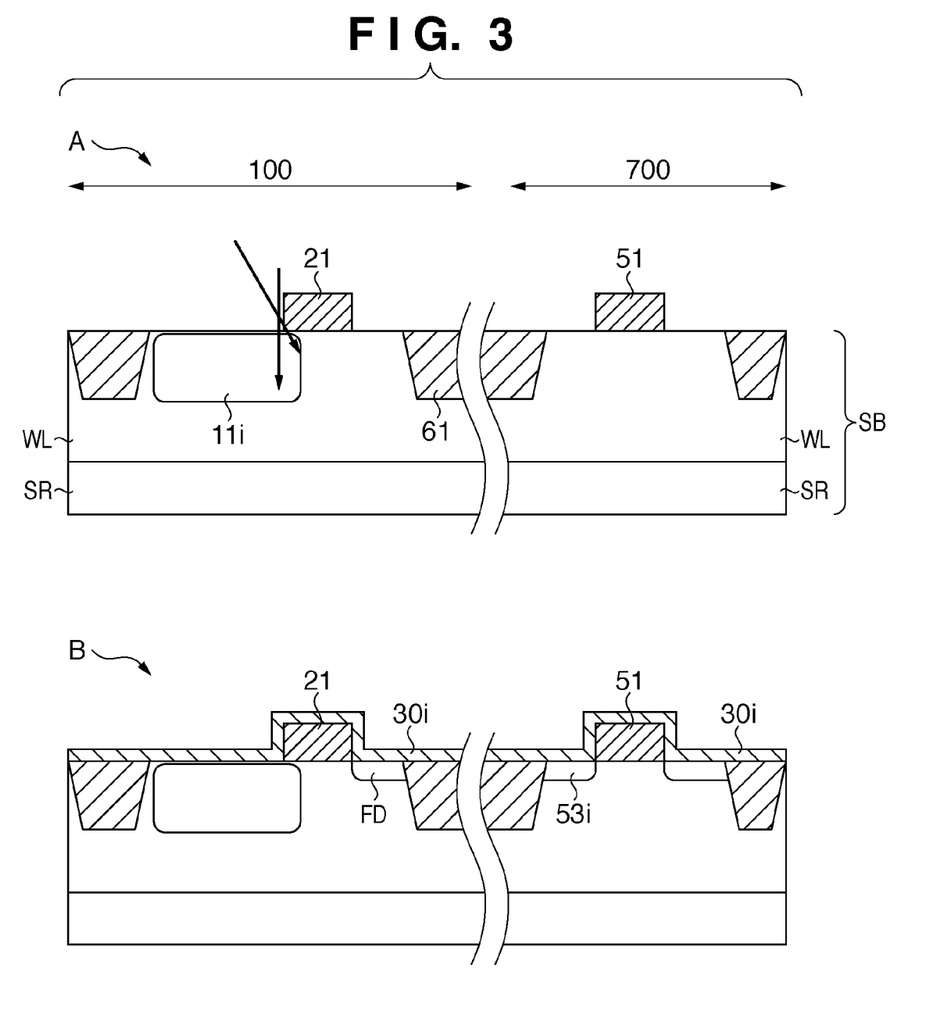
FIG. 3 is a process cross-sectional diagram illustrating the manufacturing method of the photoelectric conversion device 800 according to the embodiment of the present invention.
Figure 4:
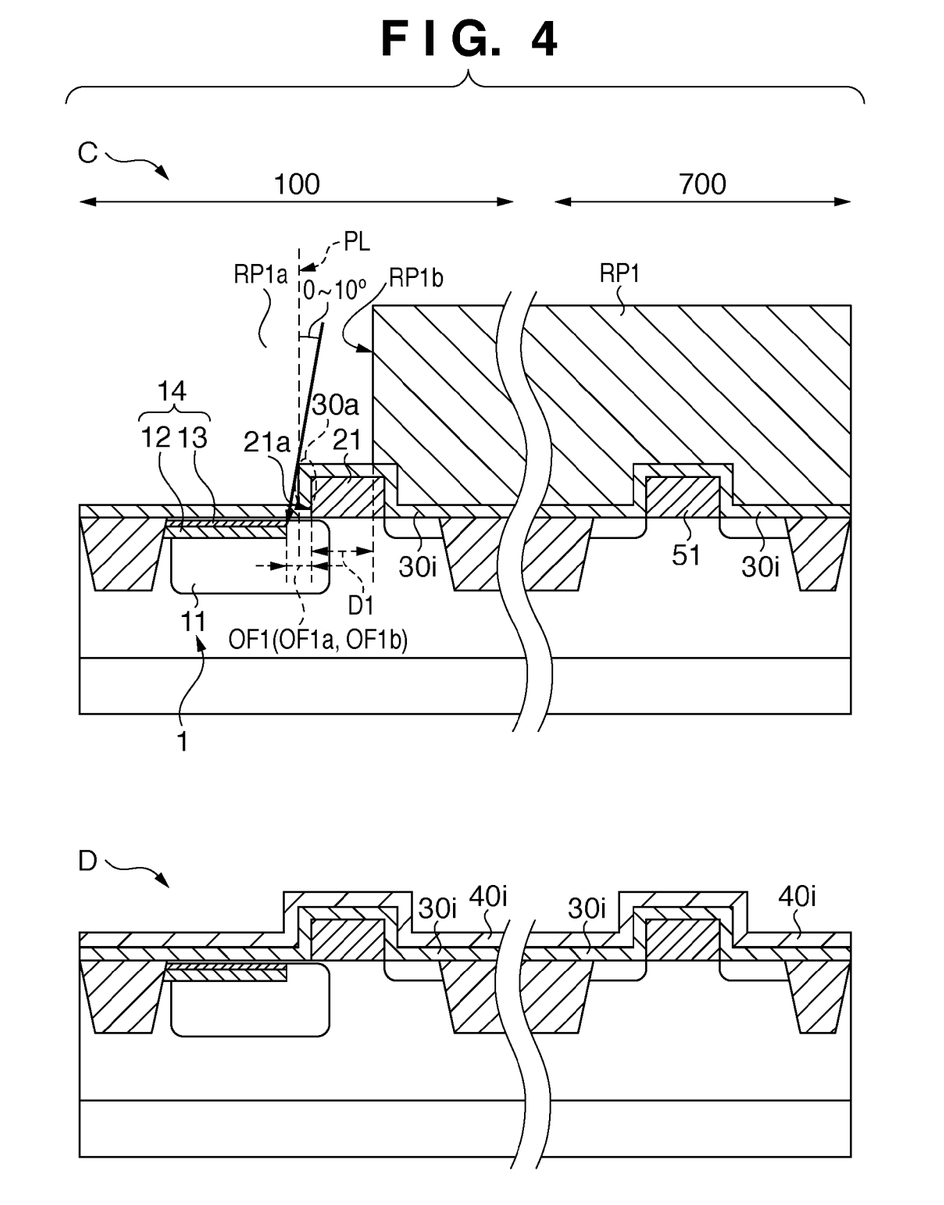
FIG. 4 is a process cross-sectional diagram illustrating the manufacturing method of the photoelectric conversion device 800 according to the embodiment of the present invention.
Figure 5:
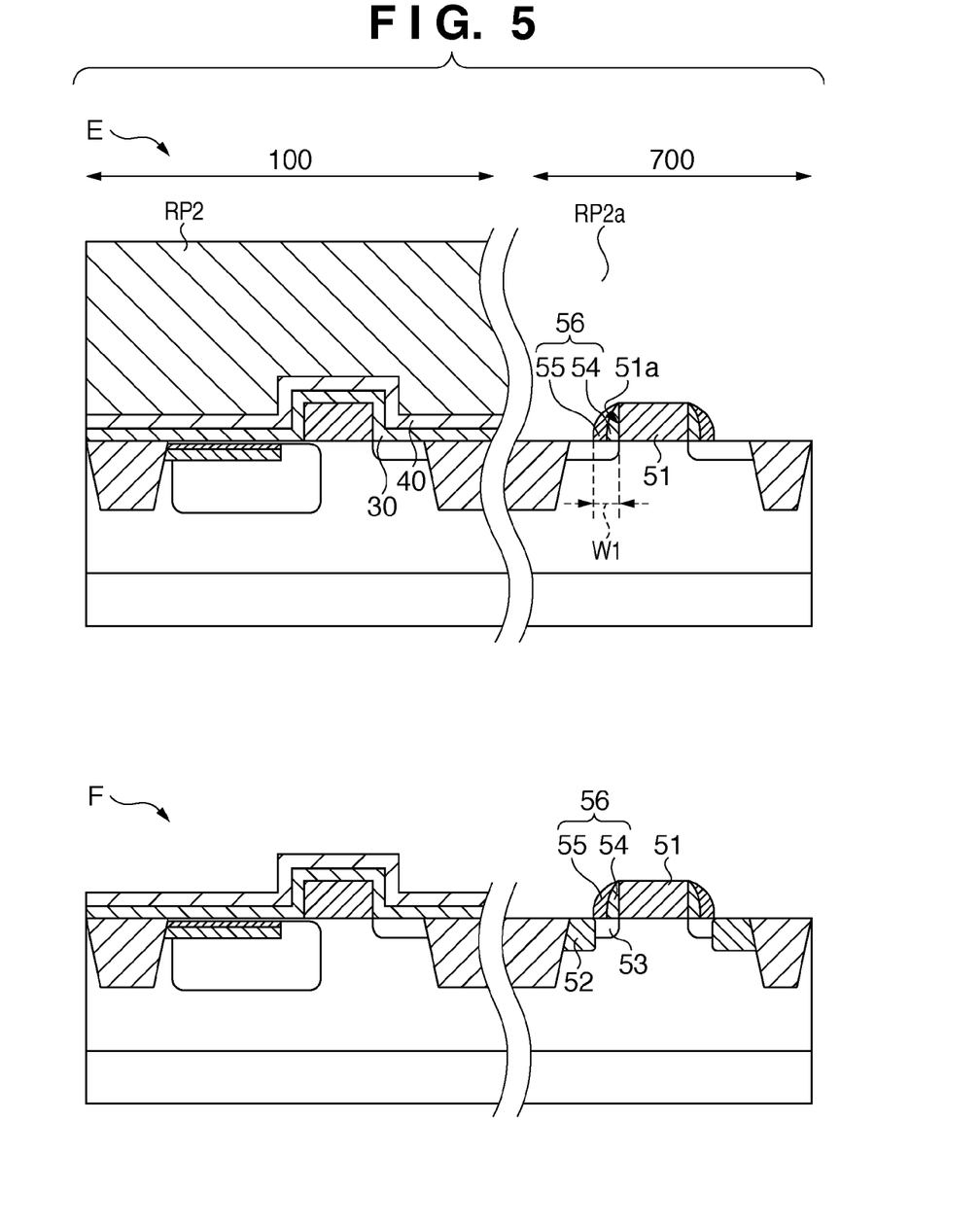
FIG. 5 is a process cross-sectional diagram illustrating the manufacturing method of the photoelectric conversion device 800 according to an embodiment of the present invention.

Next, a manufacturing method of the photoelectric conversion device 800 according to the embodiment of the present invention will be explained using FIG. 3 to FIG. 5. FIG. 3 to FIG. 5 are process cross-sectional diagrams illustrating a manufacturing method of the photoelectric conversion device 800 according to an embodiment of the present invention.

In the process (first step) illustrated in A of FIG. 3, an element isolation portion 61 is formed on the semiconductor substrate SB by an STI technique or LOCOS technique. Then, a well WL including an impurity (for example, boron) of the second conductivity type (for example P-type) at a low density is formed by implanting ions in the semiconductor substrate SB. The region of the semiconductor substrate SB in which ions have not been implanted becomes a semiconductor region SR including an impurity (for example, phosphor) of the first conductivity type (for example, N-type) at a low density.

After that, a polysilicon layer that is to become a gate electrode 21 and gate electrode 51 is formed. A resist pattern having a pattern corresponding to the gate electrode 21 and gate electrode 51 is formed on the polysilicon layer. Using this resist pattern as a mask, a gate electrode 21 of a transfer transistor 2 in the pixel array region 100 and a gate electrode 51 of a MOS transistor in the peripheral region 700 are formed on the semiconductor substrate SB.

Next (second step), a resist pattern having an opening pattern corresponding to a region that is to form a photoelectric conversion unit 1 in the pixel array region 100 and covering the entire surface of the peripheral region 700 is formed on the semiconductor substrate SB, the gate electrode 21 and the gate electrode 51. A semiconductor region 11i including an impurity of the first conductivity type is formed on the pixel array region 100 of the semiconductor substrate SB by implanting ions using the opening pattern and gate electrode 21 as a mask. The semiconductor region 11i is a semiconductor region that is to become the charge accumulation region 11. It is possible that the semiconductor region 11i is formed by implanting ions at an oblique angle from the diagonally upper portion of the gate electrode 21 to below the gate electrode, as shown in A of FIG. 3. Although an insulation film including a gate insulation film is not shown in FIG. 3, the insulation film is formed on the photoelectric conversion unit 1 and between the gate electrode 21 and the surface SBa of the semiconductor substrate SB. The insulation film is also formed between the gate electrode 51 and the surface SBa of the semiconductor substrate SB.

In the process shown in B of FIG. 3, a resist pattern having a first opening pattern corresponding to a charge-voltage converter FD and a second opening pattern corresponding to an LDD region 53 is formed on the semiconductor substrate SB, the gate electrode 21 and the gate electrode 51. Next, a charge-voltage converter FD including an impurity of the first conductivity type is formed in the pixel array region 100 of the semiconductor substrate SB by implanting ions using the first opening pattern and the gate electrode 21 as a mask. Also, a semiconductor region 53i including an impurity of the first conductivity type at a low density is formed in the peripheral region 700 of the semiconductor substrate SB by implanting ions using the second opening pattern and the gate electrode 51 as a mask. The semiconductor region 53*i* is a semiconductor region that is to become the LDD region 53.

After that (third step), an insulation film 30*i* is formed by a low-pressure CVD technique (low-pressure CVD method) so as to cover the semiconductor substrate SB, the gate electrode 21 in the pixel array region 100, and the gate electrode 51 in the peripheral region 700. The insulation film 30*i* is formed from, for example, silicon nitride. Advantages of the insulation film 30*i* formed by the low-pressure CVD technique, such as the effect that the film thicknesses formed in different positions such as on the semiconductor substrate SB and on the side face of the gate electrodes (21, 51) are approximately the same, and that the uniformity of that film thickness is easy to increase, are known. The insulation film 30*i* can have a thickness of 40 nm to 55 nm, considering that it must function as an antireflection film that prevents light from reflecting off the light-receiving surface of the photoelectric conversion unit 1.

In Japanese Patent Laid-Open No. 2005-123517, comprising the entirety of a solid-state imaging device as a low-voltage system by forming a MOS transistor such as a transfer MOS transistor of a pixel unit and a MOS transistor of a peripheral circuit using the same process is described. By this, according to Japanese Patent Laid-Open No. 2005-123517, it is possible to achieve a line sensor that can operate on a low voltage.

Here (after the process shown in B of FIG. 3), it is assumed that a side wall spacer is formed at a position neighboring the side face of the gate electrode 21 in the pixel array region 100 and at a position neighboring the side face of the gate electrode 51 in the peripheral region 700. In this case, the side wall spacers in the pixel array region 100 and the peripheral region 700 are formed by etching (etch back) the entire surfaces of the insulation film 30*i* and the insulation film 40*i* (the insulation film 40*i* to be hereinafter described). Because these side wall spacers are formed by etching from the top and sides, they have sloping side faces. Control of the amount of etching from the side is difficult compared to etching from the top, and it is difficult to control the precision of the oblique angle of that sloping surface. For this reason, in the case that ions are implanted using the gate electrode 21 in the pixel array region 100 and the side wall spacers as a mask, it is difficult to control with high precision the position of the protection region 14 with respect to the gate electrode 21. That is, it is difficult to control with high precision the offset OF1 of the boarder border of the protection region 14 from the plane including the side face 21*a* of the gate electrode 21 in the gate length direction electrode 21.

On the contrary, in the process (fourth step) shown in C of FIG. 4, a resist pattern RP1 having an opening pattern RP1*a* corresponding to a region that is to form the protection region 14 is formed on the insulation film 30*i*. Ions are implanted in the semiconductor region 11*i* of the semiconductor substrate SB using the resist pattern RP1, the gate electrode 21, and the portion 30*a* covering the side face 21*a* of the gate electrode 21 of the insulation film 30*i*, as a mask. That is, ions are implanted using the resist pattern RP1, the gate electrode 21, and the portion 30*a* covering the side face 21*a* of the gate electrode 21 as a mask in a state in which the semiconductor substrate SB, the gate electrode 21 and the gate electrode 51 are covered by the insulation film 30*i*. At this time, ions are implanted at an angle that is larger than 0° and smaller than 10° with respect to the normal line PL to the semiconductor substrate so as to be directed from above the gate electrode 21 to the semiconductor region 11*i*. By this, a protection region 14 including an impurity of the second conductivity type is formed in the semiconductor region 111, and the portion from which the protection region 14 is removed in the semiconductor region 11*i* becomes the charge accumulation region 11 including an impurity of the first conductivity type.

Here, because ions are implanted at a small oblique angle between 0° and 10°, it is possible to suppress shadowing if a sufficient distance D1 from the plane including the side face 21*a* of the gate electrode 21 of the terminal surface RP1*b* of the resist pattern RP1 is secured. Also, the offset OF1 of the border of the protection region 14 from the plane including the side face 21*a* of the gate electrode 21 in the gate length direction electrode 21 is controlled in accordance with the thickness of the insulation film 30*i*. That is, it is possible to control with high precision the offset OF1 by controlling the thickness of the insulation film 30*i*.

Also, in the case that the protection region 14 is structured to be 2-layered, the first layer 12 and the second layer 13 are formed by two ion implantation processes (first implantation step, second implantation step). In the first implantation step, a first layer including an impurity of the second conductivity type at a first density to be arranged on the charge accumulation region 11 is formed as a portion of the protection region 14 by implanting ions under a first condition. In the second ion implantation step, a second layer 13 including an impurity of the second conductivity type at a second density that is higher than the first density is formed to be arranged on the first layer 12 as another portion of the protection region 14 by implanting ions under a second condition. The second implantation step is executed after the first implantation step, for example. By this, a protection region 14 including a first layer 12 and a second layer 13 is formed such that that second layer 13 is thinner than the first layer 12. Also, a protection region 14 including a first layer 12 and a second layer 13 is formed such that the impurity density of the second layer 13 is lower than the impurity density of the first layer 12.

Note that, the ion implantation angles of the first implantation step and the second implantation step may be the same. Alternatively, the ion implantation angle of the first implantation process may be larger than the ion implantation angle of the second implantation process. By this, the offset OF1*a* of the border of the first layer 12 from the plane including the side face 21*a* of the gate electrode 21 can be controlled to be smaller than the offset OF1*b* of the boarder border of the second layer 13 from the plane including the side face 21*a* of the gate electrode 21. As a result, it becomes possible to reduce the effect of the potential barrier on the charge transfer path due to the protection region, and it is possible to further improve the charge transfer efficiency.

The resist pattern RP1 is then removed.

In the process (fifth step) shown in D of FIG. 4, an insulation film (second insulation film) 40*i* is formed to cover the insulation film 30*i*. At this time, it is possible to adjust the width W1 of the side wall spacer 56, to be hereinafter described, in the peripheral region 700 by controlling the thickness of the insulation film 40*i* (refer to E of FIG. 5). The insulation film 40*i* is formed from, for example, silicon oxide.

Here (after the process shown in D of FIG. 4), it is assumed that a side wall spacer is formed at a position neighboring the side face of the gate electrode 21 in the pixel array region 100, and at a position neighboring the side face of the gate electrode 51 in the peripheral region 700. In this case, the side wall spacers in the pixel array region 100 and in the peripheral region 700 are both formed to have a width corresponding to the aforementioned offset OF1. In this case, because the width W1 of the side wall spacer 56 must be greater than is necessary, it is difficult to miniaturize the MOS transistor in the peripheral region 700 for achieving the required charge transfer efficiency.

On the contrary, in the process (sixth step) shown in E of FIG. 5, a resist pattern RP2 that covers the pixel array region 100 and has an opening pattern RP2a corresponding to the peripheral region 700 is formed on the insulation film 40i. Etching is performed using that opening pattern RP2a as a mask. That is, a portion in the peripheral region 700 of the insulation film 30i and a portion in the peripheral region 700 of the insulation film 40i are etched such that a portion covering the side face 51a of the gate electrode 51 remains. By this, an insulation film 30 and the insulation film 40 in the pixel array region 100 are formed, and a side wall spacer 56 including a first film 54 and second film 55 is also formed. The first film 54 is a portion that is not etched and remains of the portion in the peripheral region 700 of the insulation film 30i. The second film 55 is a portion that is not etched and remains of the portion in the peripheral region 700 of the insulation film 40i. That is, because it is possible to thin the width W1 of the side wall spacer 56 in the peripheral region 700 without being affected by constraints demanded in the pixel array region 100, miniaturization of the MOS transistor in the peripheral region 700 for achieving the required charge transfer efficiency becomes easy.

In the process shown in F of FIG. 5, a resist pattern that has an opening pattern corresponding to the semiconductor region 52 is formed. Ions are implanted using this opening pattern, the gate electrode 51 and the side wall spacer 56 as a mask. By this, a semiconductor region 52 including an impurity of the first conductivity type at a high density is formed, and the portion of the semiconductor region 53i in which ions have not been implanted becomes the LDD region 53 including an impurity of the first conductivity type at a low density.

After this, an interlayer insulation film (not shown) is formed so as to cover the insulation film 40 in the pixel array region 100 and the semiconductor substrate, gate electrode 51 and side wall spacer 56 in the peripheral region 700. A contact hole that exposes the charge-voltage converter FD and semiconductor region 52 is formed on that interlayer insulation film, and after that, a contact plug is formed by embedding metal in the contact hole. Furthermore, a metal wire formation, a color filter, microlens, etc., are formed to complete a photoelectric conversion device.

In the aforementioned manner, according to the present embodiment, ions are implanted using the resist pattern RP1, the gate electrode 21, and the portion 30a covering the side face 21a of the gate electrode 21 as a mask in a state in which the semiconductor substrate SB, gate electrode 21 and gate electrode 51 are covered by the insulation film 30i. A protection region is thus formed. That is, because a process to pattern the insulation film 30 and the insulation film 40 in the pixel array region is not necessary, it is possible to reduce etching damage to the photoelectric conversion unit 1.

Also, a protection region 14 of the photoelectric conversion unit 1 is formed to be self-aligning using the gate electrode 21 and the portion 30a covering the gate electrode 21 of the insulation film 30i as a mask. That is, the offset OF1 of the border of the protection region 14 from the plane including the side face 21a of the gate electrode 21 in the gate length direction is controlled by controlling the thickness of the insulation film 30i. By this, it is possible to improve the control precision of the offset OF1 of the border of the protection region from the plane including the side face of the gate electrode of the transfer transistor in the gate length direction.

Therefore, in addition to reducing etching damage to the photoelectric conversion unit, it is also possible to improve the control precision of the offset of the protection region of the photoelectric conversion unit from the gate electrode of the transfer transistor in a photoelectric conversion device.

Also, a side wall spacer is formed at a position neighboring the gate electrode of the MOS transistor in the peripheral region without forming a side wall spacer in the pixel array region. By this, because it is possible to thin the width of the side wall spacer in the peripheral region without being affected by constraints demanded in the pixel array region, miniaturization of the MOS transistor in the peripheral region for achieving the required charge transfer efficiency becomes easy.

Therefore, in addition to miniaturization of the MOS transistor in the peripheral region, improvement in the control precision of the offset of the protection region from the transfer transistor in the pixel array region also becomes possible.

Also, because ion implantation is done using the gate electrode and portion covering the side face of the gate electrode of the insulation film as a mask, it is possible to form the protection region in the photoelectric conversion unit by implanting ions in the semiconductor substrate at an angle close to vertical. For this reason, the manufacturing variation of the protection region can be reduced, and noise due to dark current generated on the surface of the semiconductor substrate can be reduced. Therefore, it is possible to provide a manufacturing method that is suitable for manufacture of a photoelectric conversion device that has smaller pixel dimensions.

Furthermore, according to the aforementioned manufacturing method, it is possible to form each of a protection region of a photoelectric conversion unit in a pixel array region and an LDD structure of a transistor in a peripheral region with good control and with few processes (few in the numbers of steps).

Figure 6:
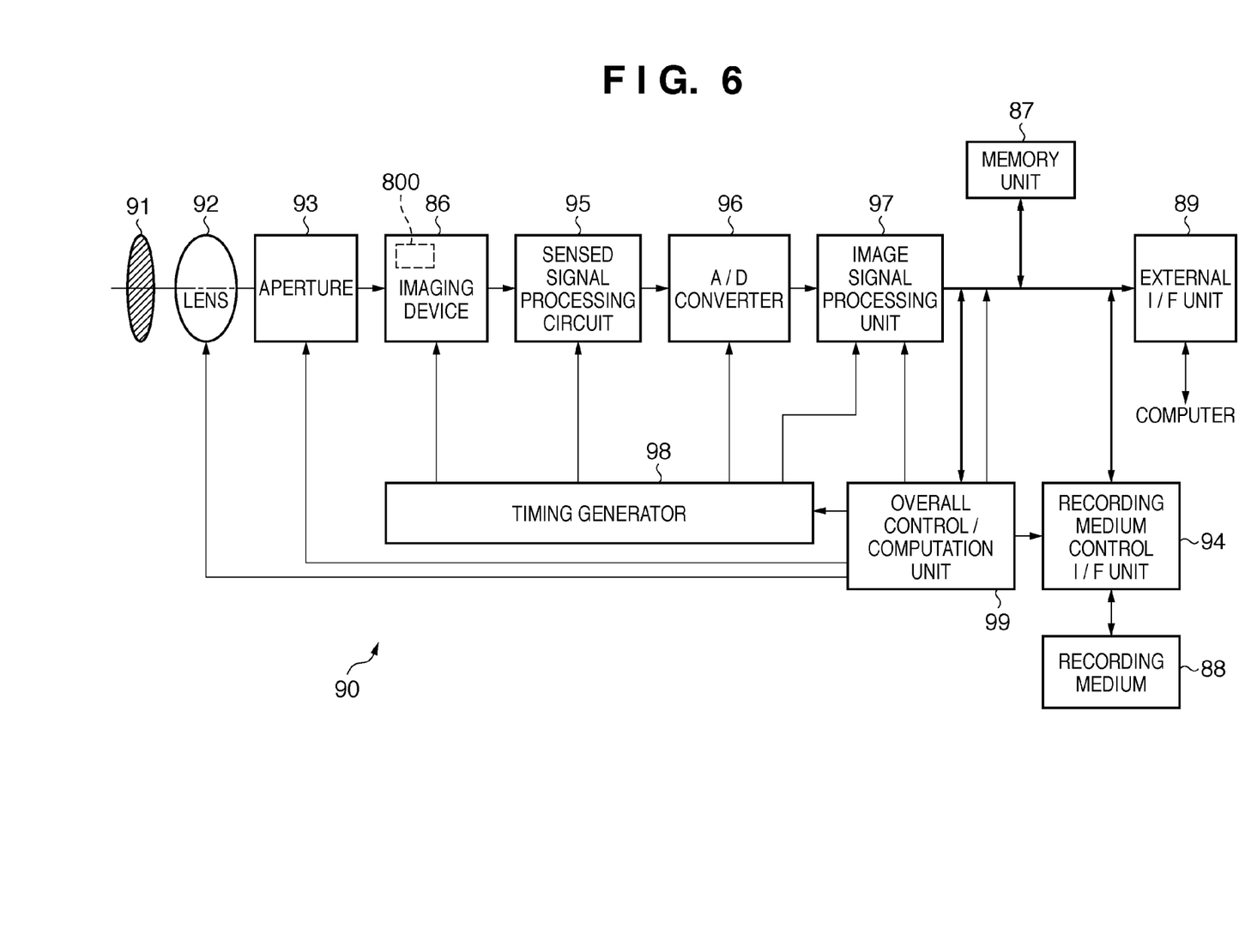
FIG. 6 is a structural diagram of an imaging system adopting the photoelectric conversion device according to the first embodiment.

Next, an example of an imaging system that adopts the photoelectric conversion device of the present invention is illustrated in FIG. 6.

An imaging system 90 is mainly provided with an optical system, imaging device 86 and signal processing unit, as shown in FIG. 6. The optical system is mainly provided with a shutter 91, a lens 92 and aperture 93. The imaging device 86 includes a photoelectric conversion device 800. The signal processing unit is mainly provided with an sensed signal processing circuit 95, an A/D converter 96, an image signal processing unit 97, a memory unit 87, an external I/F unit 89, a timing generator 98, an overall control/computation unit 99, recording medium 88, and recording medium control I/F unit 94. Moreover, the signal processing unit does not need to be provided with a recording medium 88.

The shutter 91 is installed in front of the lens 92 along the light path, and controls exposure.

The lens 92 refracts incident light to form an image of the photographic subject on an imaging surface (pixel array region 100) of the photoelectric conversion device 800 of the imaging device 86.

The aperture 93 is installed between the lens 92 and photoelectric conversion device 800 in the light path, and regulates the amount of light directed to the photoelectric conversion device 800 after passing through the lens 92.

The photoelectric conversion device 800 of the imaging device 86 converts the image of the photographic subject formed on the imaging surface of the photoelectric conversion device 800 to an image signal. The imaging device 86 reads out that image signal from the photoelectric conversion device 800 and outputs it.

The sensed signal processing circuit 95 is connected to the imaging device 86, and processes the image signal output from the imaging device 86.

The A/D converter 96 is connected to the sensed signal processing circuit 95, and converts the post-processing image signal (analog signal) output from the sensed signal processing circuit 95 to an image signal (digital signal).

The image signal processing unit 97 is connected to the A/D converter 96, executes computational processing such as various corrections, etc., on the image signal (digital signal) output from the A/D converter 96, and generates image data. This image data is provided to the memory unit 87, the external I/F unit 89, the overall control/computation unit 99, and the recording medium control I/F unit 94, etc.

The memory unit 87 is connected to the image signal processing unit 97, and stores the image data output from the image signal processing unit 97.

The external I/F unit 89 is connected to the image signal processing unit 97. By this, image data output from the image signal processing unit 97 is transferred to an external device (PC, etc.) through the external I/F unit 89.

The timing generator 98 is connected to the imaging device 86, the sensed signal processing circuit 95, the A/D converter 96, and the image signal processing unit 97. By this, a timing signal is supplied to the imaging device 86, the sensed signal processing circuit 95, the A/D converter 96, and the image signal processing unit 97. The imaging device 86, the sensed signal processing circuit 95, the A/D converter 96, and the image signal processing unit 97 then synchronize with the timing signal and operate.

The overall control/computation unit 99 is connected to the timing generator 98, the image signal processing unit 97 and the recording medium control I/F unit 94, and performs overall control of the timing generator 98, the image signal processing unit 97 and the recording medium control I/F unit 94.

The recording medium 88 is detachably connected to the recording medium control I/F unit 94. By this, image data output from the image signal processing unit 97 is recorded to the recording medium 88 through the recording medium control I/F unit 94.

By the aforementioned structure, if a favorable image signal can be obtained in the photoelectric conversion device 800, a favorable image (image data) can be obtained.

Moreover, the present invention is not limited to the aforementioned embodiments, and modifications are possible as needed. For example, the well WL may be a region including an impurity not of the second conductivity type but of the first conductivity type (for example, N-type) at a low density. Also, the well WL may be formed by epitaxial growth on the semiconductor region SR, even if it is formed by ion implantation. Furthermore, the semiconductor region 11*i* that is to become the charge accumulation region may be formed using a resist pattern as a mask, before the gate electrode 21 is formed.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-002917, filed Jan. 8, 2009, which is hereby incorporated by reference herein in its entirety.

What is claimed is:

1. A manufacturing method for manufacturing a photoelectric conversion device that has a pixel array region in which a plurality of pixels are to be arrayed, each of the plurality of pixels including a photoelectric conversion unit that has a charge accumulation region and protection region arranged on the charge accumulation region, a charge-voltage converter, a transfer transistor that transfers charges in the charge accumulation region to the charge-voltage converter, and an output unit that outputs a signal in accordance with a voltage of the charge-voltage converter, the method comprising:
   a first step of forming a gate electrode of the transfer transistor in the pixel array region on a semiconductor substrate;
   a second step of forming a semiconductor region of a first conductivity type in the pixel array region of the semiconductor substrate;
   a third step of forming an insulation film so as to cover the semiconductor substrate and the gate electrode of the transfer transistor; and
   a fourth step of forming the protection region of a second conductivity type, which is the opposite conductivity type to the first conductivity type, by implanting ions in the semiconductor region of the semiconductor substrate using the gate electrode of the transfer transistor and a portion of the insulation film which covers a side face of the gate electrode of the transfer transistor as a mask in a state in which the semiconductor substrate and the gate electrode of the transfer transistor are covered by the insulation film, and causing a portion of the semiconductor region of the first conductivity type other than the protective region to be the charge accumulation region.

2. The method according to claim 1,
wherein the photoelectric conversion device further has a peripheral region that is a region different from the pixel array region and in which a control circuit including a MOS transistor for controlling the plurality of pixels is to be arranged,
wherein in the first step, in addition to the formation of the gate electrode of the transfer transistor in the pixel array region, a gate electrode of the MOS transistor in the peripheral region is formed,
wherein in the third step, the insulation film is formed so as to cover the semiconductor substrate, the gate electrode of the transfer transistor, and the gate electrode of the MOS transistor,
said method further comprising:
a fifth step of forming a second insulation film so as to cover the insulation film after the fourth step; and
a sixth step of forming a side wall spacer at a position neighboring the side face of the gate electrode of the MOS transistor by etching a region of the insulation film which is arranged in the peripheral region and a region of the second insulation film which is arranged in the peripheral region such that a portion of each of the insulation film and the second insulation film which covers a side face of the gate electrode of the MOS transistor remains.

3. The method according to claim 2, wherein,
in the third step, the insulation film is formed from silicon nitride, and
in the fifth step, the second insulation film is formed from silicon oxide.

4. The method according to claim 1, wherein,
in the fourth step, an offset distance between an edge of the protection region and an edge of the gate electrode of the transfer transistor is controlled by controlling a thickness of the insulation film.

5. The method according to claim 1, wherein,
in the fourth step, ions are implanted at an angle larger than 0° and smaller than 10° with respect to a normal line to the semiconductor substrate so as to be directed from above the gate electrode of the transfer transistor toward the semiconductor region.

6. The method according to claim 1, wherein the fourth step includes:
   a first implantation step of forming a first layer including an impurity of the second conductivity type at a first density as a first portion of the protection region by implanting ions under a first condition; and
   a second implantation step of forming a second layer arranged on the first layer, including an impurity of the second conductivity type at a second density that is higher than the first density as a second portion of the protection region by implanting ions under a second condition.

7. The method according to claim 6, wherein,
an offset distance between an edge of the first layer and an edge of the gate electrode of the transfer transistor is larger than an offset distance between an edge of the second layer and an edge of the gate electrode of the transfer transistor.

8. The method according to claim 1, wherein
the insulation film functions as an anti-reflection film that prevents the reflection of light off of a light-receiving surface of the photoelectric conversion unit.

9. The method according to claim 1, wherein,
in the third step, the insulation film is formed by a low-pressure CVD method.

10. The method according to claim 1, wherein,
in the second step, the semiconductor region of the first conductivity type is formed by ion implantation using the gate electrode of the transfer transistor as a mask.

* * * * *